United States Patent
Wu

(10) Patent No.: US 6,930,550 B1
(45) Date of Patent: Aug. 16, 2005

(54) SELF-BIASING DIFFERENTIAL BUFFER WITH TRANSMISSION-GATE BIAS GENERATOR

(75) Inventor: Ke Wu, San Jose, CA (US)

(73) Assignee: Pericom Semiconductor Corp., San Jose, CA (US)

( * ) Notice: Subject to any disclaimer, the term of this patent is extended or adjusted under 35 U.S.C. 154(b) by 0 days.

(21) Appl. No.: 10/709,267

(22) Filed: Apr. 26, 2004

(51) Int. Cl.[7] .................................................. H03F 3/45
(52) U.S. Cl. ..................... 330/261; 330/253; 330/255; 330/259
(58) Field of Search ................................ 330/251, 152, 330/257, 259, 260, 261; 327/52, 87, 206; 326/65, 71, 81, 83

(56) References Cited

U.S. PATENT DOCUMENTS

| | | | |
|---|---|---|---|
| 3,914,702 A | 10/1975 | Gebweller | 330/13 |
| 4,074,150 A | 2/1978 | Buckley, III et al. | 327/87 |
| 4,074,151 A | 2/1978 | Buckley, III et al. | 327/87 |
| 4,430,582 A | 2/1984 | Bose et al. | 326/65 |
| 4,437,024 A | 3/1984 | Wacyk | 326/71 |
| 4,438,352 A | 3/1984 | Mardkha | 326/71 |
| 4,477,736 A | 10/1984 | Onishi | 327/543 |
| 4,563,595 A | 1/1986 | Bose | 327/206 |
| 4,677,321 A | 6/1987 | Bacrania | 326/71 |
| 4,937,476 A | 6/1990 | Bazes | 326/71 |
| 4,958,133 A | 9/1990 | Bazes | 330/253 |
| 5,278,467 A | 1/1994 | Nedwek | 327/52 |
| 5,635,860 A | 6/1997 | Westerwick | 326/81 |
| 5,963,094 A * | 10/1999 | Linder et al. | 330/264 |
| 6,049,229 A * | 4/2000 | Manohar et al. | 326/83 |
| 6,278,323 B1 | 8/2001 | Bazes | 330/257 |
| 6,424,571 B1 * | 7/2002 | Pekny | 365/185.21 |
| 6,469,579 B2 | 10/2002 | Bazes | 330/253 |
| 6,566,926 B1 | 5/2003 | Patterson | 327/206 |
| 6,605,997 B1 * | 8/2003 | Hanson et al. | 330/253 |
| 6,642,791 B1 * | 11/2003 | Balan | 330/253 |
| 6,750,684 B2 * | 6/2004 | Lim | 327/108 |
| 6,804,305 B1 * | 10/2004 | Chan | 375/257 |

\* cited by examiner

*Primary Examiner*—Michael Tokar
*Assistant Examiner*—Linh V Nguyen
(74) *Attorney, Agent, or Firm*—Stuart T. Auvinen

(57) ABSTRACT

A self-biasing differential buffer generates a self-bias voltage from its inputs. A first amplifier receives a first input signal on gates of four transistors—p and n-channel drive transistors in a drive branch and p and n-channel bias-generating transistors in a bias-generating branch. Current source and current sink transistors source and sink current to both branches. The drains of the drive transistors drive a differential output, while the drains of the bias-generating transistors drive through a transmission gate to a self-bias node. The second amplifier receives the second input signal and has the same structure, with one branch driving the self-bias voltage through another transmission gate, and another branch driving a complementary differential output. The bias-generating branches use smaller transistors so that only a small current is used to generate the self-bias voltage. The self-bias node is fed to the gates of current source and sink transistors.

21 Claims, 4 Drawing Sheets

US 6,930,550 B1

SELF-BIASING DIFFERENTIAL BUFFER WITH TRANSMISSION-GATE BIAS GENERATOR

BACKGROUND OF INVENTION

This invention relates to differential buffers, and more particularly to self-biasing of differential buffers.

Differential buffers are a widely used building block in electronic systems. Input signals can be fully differential, with a true and a second, complement line that are driven to opposite states. Many kinds of low-voltage differential signaling (LVDS) have been developed and are available.

Differential buffers can also be used with single-ended input signals. The single input signal is compared to a reference voltage by the differential buffer. The reference voltage can be applied to the inverting (negative) input of the differential buffer while the input signal is applied to the non-inverting (positive) input.

FIG. 1 shows a differential buffer comparing an input signal to a reference voltage. Differential buffer 10 receives an input signal DIN on the non-inverting (+) input, and a reference voltage VREF on its inverting (−) input. Output Q is driven high when the input voltage of DIN is above VREF; otherwise output Q is driven low by differential buffer 10.

The reference voltage VREF can be set to the logic threshold level of input signal DIN. This switching threshold is often set to be half of the power-supply voltage, or VDD/2. Reset signal RST can be activated to reset the output.

Internal bias voltages are often used in complementary metal-oxide-semiconductor (CMOS) amplifiers and buffers. A voltage divider between power and ground can generate one or more bias voltages that are applied to gates of current source transistors in the differential amplifier. The voltage divider often is a series connection of transistors, and may include one or more resistors in series with the transistors.

The voltage divider generating the bias voltages has the disadvantage of no feedback to compensate for temperature, power-supply, and process variations.

What is differential buffer that generates its own bias voltages without an input from a voltage divider between power and ground. A self-biased differential buffer is desirable.

DETAILED DESCRIPTION

The present invention relates to an improvement in self-biasing differential buffers. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

The inventor has realized that bias voltages can be generated from the differential inputs rather than from a separate voltage divider between power and ground. A common-mode voltage is generated between the two differential inputs. The differential inputs are buffered and applied to transmission gates. A node between two transmission gates is used as the self-generated bias voltage.

Figure 1:
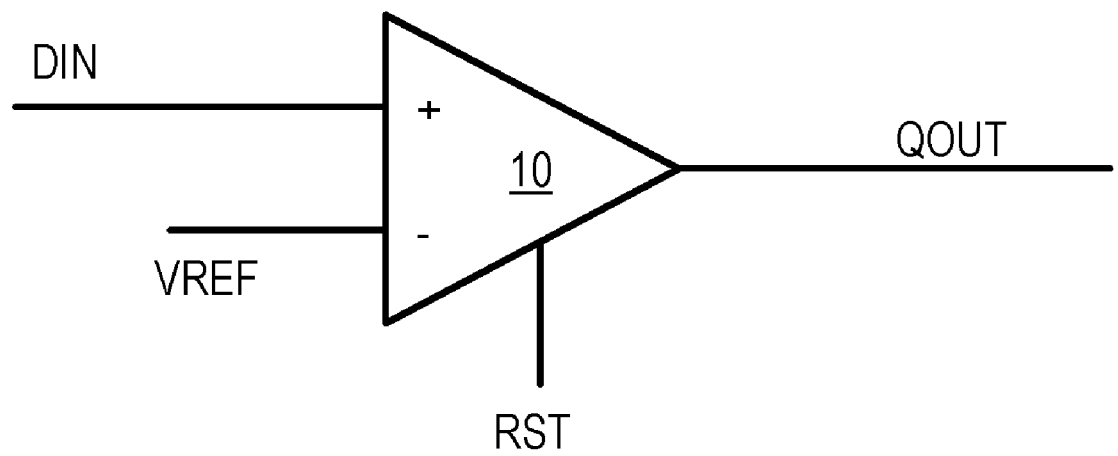
FIG. 1 shows a differential buffer comparing an input signal to a reference voltage.
Figure 2:
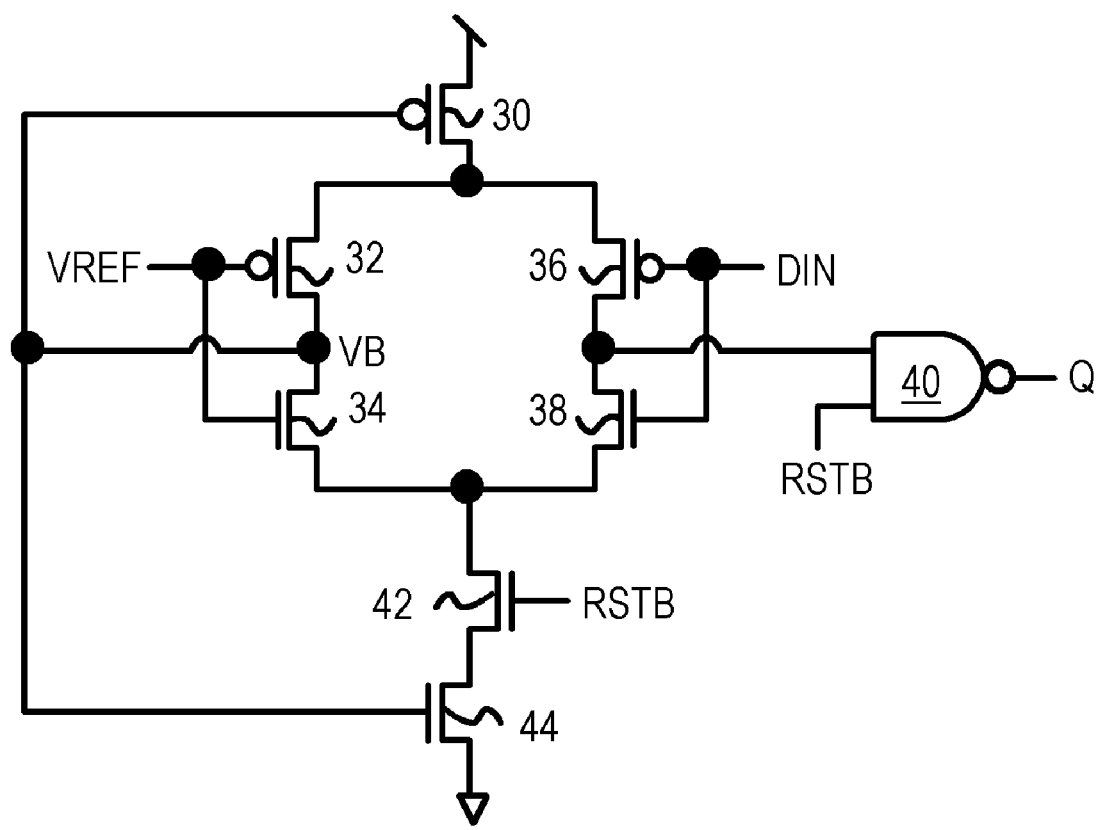
FIG. 2 is a schematic of a simplified self-biased differential buffer with a single output.

FIG. 2 is a schematic of a simplified self-biased differential buffer with a single output. This simplified embodiment does not use transmission gates or differential outputs.

Reference voltage VREF is compared to the DIN signal input voltage by the buffer. Reference voltage VREF is applied to the gates of p-channel reference transistor 32 and n-channel reference transistor 34. The drains of reference transistors 32, 34 are tied together and generate the self-bias voltage VB. Self-bias voltage VB is fed back to the gates of p-channel current-source transistor 30 and n-channel current-sink transistor 44.

Reset transistor 42 is an n-channel transistor receiving reset signal RSTB at its gate, and cuts off current flow in the differential buffer when reset is active and RSTB is low. Reset transistor 42 conducts between the sources of transistors 34, 38 and n-channel current-sink transistor 44 to ground.

The data input signal DIN is applied to the gates of p-channel input transistor 36 and n-channel input transistor 38. The drains of input transistors 36, 38 drive an input of NAND gate 40, which drives output Q. The other input of NAND gate 40 is the active-low reset signal RSTB. When reset is active, NAND gate 40 drives Q high, blocking the data.

Current from p-channel current-source transistor 30 divides into two branches. One branch through reference transistors 32, 34 sets the self-reference voltage VB, while the other current branch through input transistors 36, 38 drives the output. The two branch currents are combined at the drain of reset transistor 42 and the current sunk is set by n-channel current-sink transistor 44, since VB is usually less than RSTB, which is usually at VDD.

When DIN is higher than VREF, n-channel input transistor 38 tends to conduct more current than n-channel reference transistor 34. Also, p-channel input transistor 36 tends to conduct less than p-channel reference transistor 32, for equal-sized transistors. This causes the input to NAND gate 40 to fall, driving Q high.

Self-bias voltage VB also rises somewhat. The rising VB increases current sunk in n-channel current-sink transistor 44 but decreases the current sourced by p-channel current-source transistor 30. This helps to lower VB, compensating for the rise in VB due to DIN rising above VREF. Thus the self-bias voltage is self-compensating.

When DIN is lower than VREF, n-channel input transistor 38 tends to conduct less current than n-channel reference transistor 34. Also, p-channel input transistor 36 tends to conduct more current than p-channel reference transistor 32, for equal-sized transistors. This causes the input to NAND gate 40 to rise, driving Q low.

Self-bias voltage VB also falls somewhat. The falling VB decreases current sunk in n-channel current-sink transistor 44 but increases the current sourced by p-channel current-source transistor 30. This helps to raise VB, compensating for the fall in VB due to DIN falling below above VREF. The self-bias voltage is again self-compensating.

The self-compensation of self-bias voltage VB is due to a feedback mechanism. Since VB tends to remain constant, the propagation delay through the differential buffer remains relatively constant, despite shifts in input voltage DIN. Having a relatively constant propagation delay is useful in some applications, since it reduces variation in output timing.

The amplification or gain from VREF to Q is much smaller than the gain from input DIN to Q, since the drains of DIN input transistors 36, 38 drive NAND gate 40 to the output, while reference transistors 32, 34, which receive input VREF, are not directly connected to NAND gate 40. A large voltage change in VREF produces a very small change in Q, since any changes in VREF have to couple through p-channel current-source transistor 30 or n-channel current-sink transistor 44.

The energy of input VREF is mostly used to generate the self-bias referenced voltage VB, with little of the input energy going to output Q. In contrast, most of the energy from input DIN is used to generate the Q output.

While the differential buffer of FIG. 2 is useful when one input is a reference voltage that does not carry a varying small signal, the differential buffer is not useful when both inputs carry varying input signals, such as for a full differential signal. The self-bias voltage is more sensitive to the reference voltage VREF than to the DIN input voltage. A more balanced self-biasing differential buffer is desirable.

Figure 3:
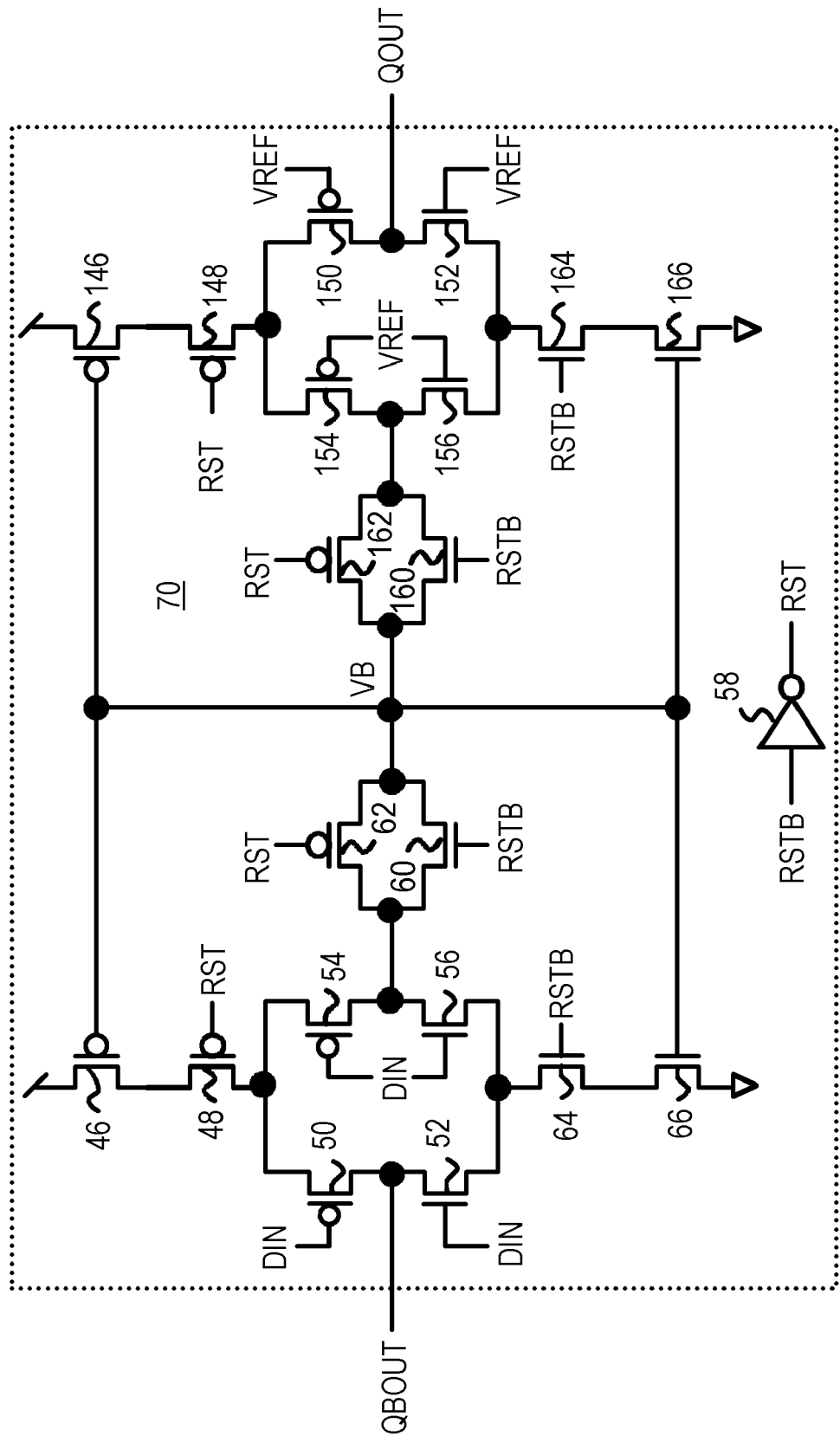
FIG. 3 is a schematic of a balanced differential buffer core with transmission gates that generate a self-bias voltage.

FIG. 3 is a schematic of a balanced differential buffer core with transmission gates that generate a self-bias voltage. Buffer core 70 has two input amplifiers. One input amplifier received data input DIN, while the other receives the reference voltage VREF. The two input amplifiers are coupled together by transmission gates to generate the self-bias voltage VB.

Each input amplifier has two current branches. One branch carries a higher current and drives output buffers, while the other branch carries a smaller current, and drives the transmission gate to generate the self-bias voltage. Thus most of the amplifier's energy is directed to generating the output, with a small amount of the energy for generating the self-bias voltage. For example, 10% of the energy may go toward self-bias generation, with 90% of the energy going toward output generation.

The DIN input amplifier has p-channel reference transistor 46 receiving self-bias voltage VB at its gate, to source a current through p-channel reset transistor 48 to the upper branching node. N-channel current-sink transistor 66 also receives self-bias voltage VB at its gate, and sinks a current from the lower branching node through n-channel reset transistor 64.

One current branch between the upper and lower branching nodes passes through p-channel drive transistor 50 and n-channel drive transistor 52, which both receive input DIN at their gates. The drains of drive transistors 50, 52 drive the QBOUT output. Most of the current from p-channel reference transistor 46 passes through this branch.

A second current branch between the upper and lower branching nodes passes through p-channel bias-generating transistor 54 and n-channel bias-generating transistor 56, which both receive input DIN at their gates. The drains of bias-generating transistors 54, 56 drive a transmission gate of p-channel transistor 62 and n-channel transistor 60. The other side of this transmission gate is the self-bias voltage VB. Thus this second current branch is used to generate the self-bias voltage. A smaller current passes through bias-generating transistors 54, 56 than through drive transistors 50, 52, since transistors 50, 52 can have a larger size (W/L) than transistors 54, 56. For example, transistors 50, 52 can have ten times the width of transistors 54, 56. Thus little energy is used for generating the self-bias voltage VB.

The VREF input amplifier has p-channel reference transistor 146 receiving self-bias voltage VB at its gate. Reference transistor 146 sources a current through p-channel reset transistor 148 to the upper branching node. N-channel current-sink transistor 166 also receives self-bias voltage VB at its gate, and sinks a current from the lower branching node through n-channel reset transistor 164.

One current branch between the upper and lower branching nodes passes through p-channel drive transistor 150 and n-channel drive transistor 152, which both receive input VREF at their gates. The drains of drive transistors 150, 152 drive the QOUT output. Most of the current from p-channel reference transistor 146 passes through this branch.

A second current branch between this amplifier's upper and lower branching nodes passes through p-channel bias-generating transistor 154 and n-channel bias-generating transistor 156, which both receive input VREF at their gates. The drains of bias-generating transistors 154, 156 drive a transmission gate of p-channel transistor 162 and n-channel transistor 160. The other side of this transmission gate is the self-bias voltage VB. Thus this second current branch is used to generate the self-bias voltage. A smaller current passes through bias-generating transistors 154, 156 than through drive transistors 150, 152, since transistors 150, 152 can have a larger size (W/L) than transistors 154, 156.

The differential buffer is symmetric. Inputs DIN and VREF can be interchanged. Rather than have a fixed reference voltage, a time-varying differential signal can be applied to the VREF input as well as the DIN input. The energy directed toward the bias generation is roughly the same for both inputs, since the circuit is balanced.

The circuit can be powered down by activating reset. Inverter 58 generates active-high RST from an active-low input RSTB. When RSTB is low (active), n-channel reset transistors 64, 164 turn off, and n-channel transmission gate transistors 60, 160 also turn off, allowing VB to float. During reset, RST is high, and p-channel reset transistors 48, 148 and p-channel transmission gate transistors 62, 162 all turn off. Current flow from power through transistors 62, 162, 80, 90 (FIG. 4) is halted during reset by these transistors turning off. When reset is inactive, these transistors are turned on.

Figure 4:
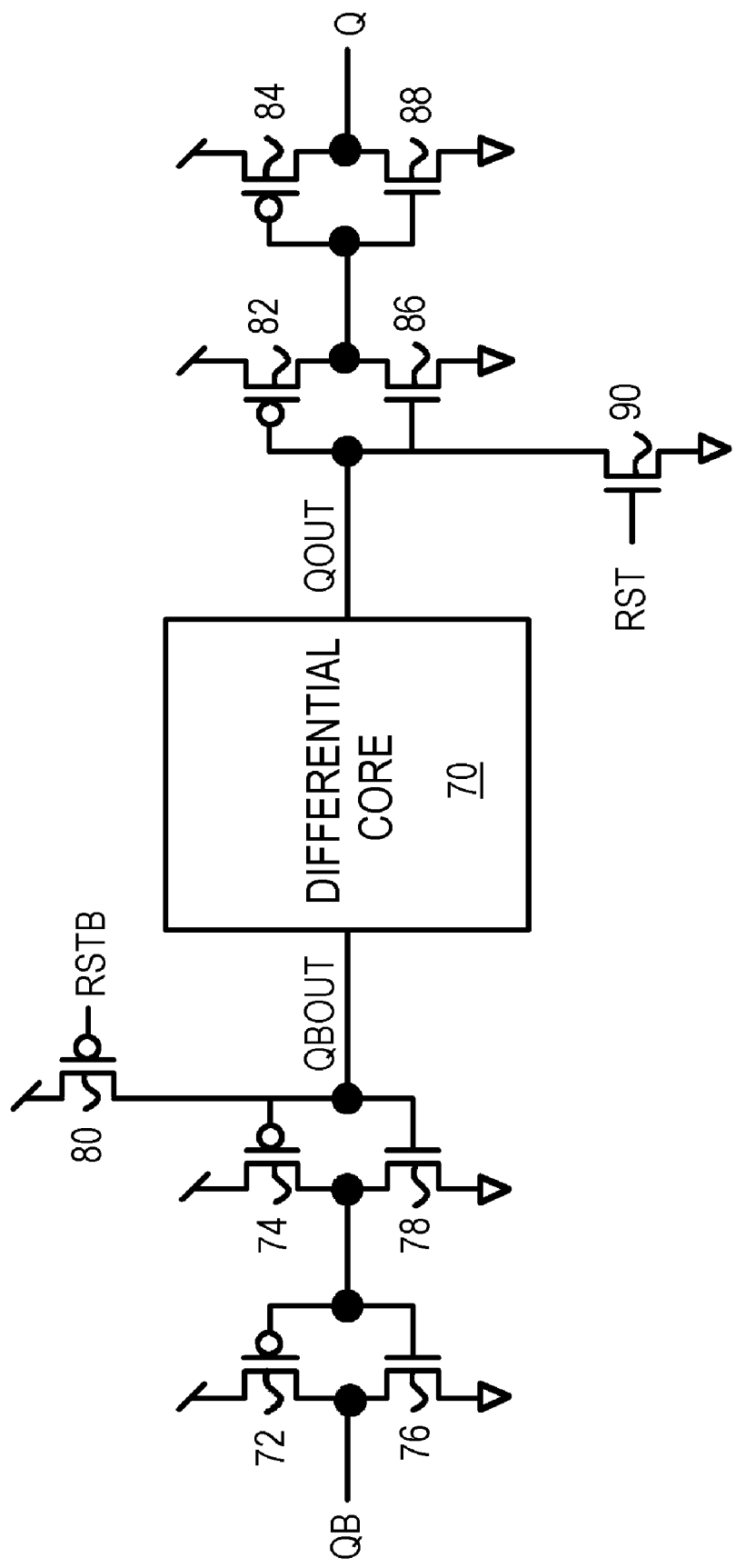
FIG. 4 shows output buffering around the buffer core.

FIG. 4 shows output buffering around the buffer core. Buffer core 70, shown in FIG. 3, generates differential outputs QOUT, QBOUT. QOUT is pulled low by n-channel reset transistor 90 when reset signal RST is high. QBOUT is pulled high by p-channel reset transistor 80 when reset signal RSTB is low.

When reset is off, QOUT is inverted by first inverting transistors 82, 86. The drains of first inverting transistors 82, 86 are applied to the gates of second inverting transistors 84, 88, which drive output Q from their drains.

QBOUT is inverted by first inverting transistors 74, 78 when reset is off. The drains of first inverting transistors 74, 78 are applied to the gates of second inverting transistors 72, 76, which drive output QB from their drains.

For a power-supply voltage of 1.8 volts, the input signal can vary from 0.675v to 1.125v with minimal change in output delay. Other voltages and common-mode ranges are possible.

ALTERNATE EMBODIMENTS

Several other embodiments are contemplated by the inventors. For example, different transistors sizes and shapes could be used, and in differing ratios. The differential buffer could receive a clock signal, or a data or control signal as the data input DIN. Additional components such as capacitors and resistors could be added, and active buffers and inverters could be added. The differential outputs or inputs could be swapped, buffered, or inverted. Various transistor sizes could be used, and transistors could be ratioed in size to ratio currents. A full differential signal D+, D−, rather than DIN and VREF could be input to the balanced self-biasing differential buffer. Thus VREF could be replaced by DIN− in FIGS. 3, 4.

When there is no requirement for a power-down mode, several transistors can be deleted. Without a power-saving or rest mode, transistors 60, 62, 160, 162, 48, 148, 64, 164 may be deleted.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claims elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A self-biased differential buffer comprising:
    a first input;
    a second input;
    a first current source transistor that drives a first current to a first upper branch node;
    a first upper drive transistor having a gate receiving the first input, and a drain driving a first output, for conducting a first drive portion of the first current;
    a first upper bias-generating transistor, having a gate receiving the first input, and a drain driving a first bias-generating node, for conducting a first bias-generating portion of the first current;
    a first lower drive transistor having a gate receiving the first input, and a drain driving the first output, for conducting to a first lower branch node;
    a first lower bias-generating transistor, having a gate receiving the first input, and a drain driving the first bias-generating node, for conducting to the first lower branch node;
    a first current sink transistor that sinks current from the first lower branch node;
    a first transmission gate between the first bias-generating node and a bias node;
    a second current source transistor that drives a second current to a second upper branch node;
    a second upper drive transistor having a gate receiving the second input, and a drain driving a second output, for conducting a second drive portion of the second current;
    a second upper bias-generating transistor, having a gate receiving the second input, and a drain driving a second bias-generating node, for conducting a second bias-generating portion of the second current;
    a second lower drive transistor having a gate receiving the second input, and a drain driving the second output, for conducting to a second lower branch node;
    a second lower bias-generating transistor, having a gate receiving the second input, and a drain driving the second bias-generating node, for conducting to the second lower branch node;
    a second current sink transistor that sinks current from the second lower branch node; and
    a second transmission gate between the second bias-generating node and the bias node.

2. The self-biased differential buffer of claim 1 wherein the bias node carries a bias voltage applied to a gate of the first current source transistor and to a gate of the second current source transistor.

3. The self-biased differential buffer of claim 2 wherein the bias node is connected to a gate of the first current sink transistor and to a gate of the second current sink transistor.

4. The self-biased differential buffer of claim 3 wherein the first transmission gate comprises a first p-channel transmission gate transistor and a first n-channel transmission gate transistor that conduct current in parallel between the first bias-generating node and the bias node;
    wherein the second transmission gate comprises a second p-channel transmission gate transistor and a second n-channel transmission gate transistor that conduct current in parallel between the second bias-generating node and the bias node.

5. The self-biased differential buffer of claim 4 wherein a gate of the first p-channel transmission gate transistor and a gate of the second p-channel transmission gate transistor are driven by an active-high reset signal or an active-high power-down signal that is activated by being driven to a high voltage to disable the first and second p-channel transmission gate transistors during a reset or during a power-down mode;
    wherein a gate of the first n-channel transmission gate transistor and a gate of the second n-channel transmission gate transistor are driven by an active-low reset signal or an active-low power-down signal that is activated by being driven to a low voltage to disable the first and second n-channel transmission gate transistors during the reset or during the power-down mode,
    whereby the first and second transmission gates are disabled during reset or the power-down mode.

6. The self-biased differential buffer of claim 2 wherein the first drive portion of the first current is greater than the first bias-generating portion of the first current, whereby more current is used for generating outputs than for generating the bias voltage.

7. The self-biased differential buffer of claim 6 wherein the first drive portion of the first current is ten times greater than the first bias-generating portion of the first current.

8. The self-biased differential buffer of claim 2 further comprising:
    a first upper reset transistor, connected in series to conduct the first current between the first current source transistor and the first upper branch node;

a first lower reset transistor, connected in series to conduct between the first lower branch node and the first current sink transistor;

a second upper reset transistor, connected in series to conduct the second current between the second current source transistor and the second upper branch node;

a second lower reset transistor, connected in series to conduct between the second lower branch node and the second current sink transistor;

wherein the first and second upper reset transistors receive a reset signal that stops current conduction through the first and second upper reset transistors during reset or during a power-down mode;

wherein the first and second lower reset transistors receive an active-low reset signal that stops current conduction through the first and second lower reset transistors during reset or during the power-down mode.

9. The self-biased differential buffer of claim 8 wherein the first and second upper reset transistors are p-channel transistors;

wherein the first and second lower reset transistors are n-channel transistors.

10. The self-biased differential buffer of claim 9 further comprising:

a first output buffer, having an input receiving the first output, for driving a first buffered output;

a second output buffer, having an input receiving the second output, for driving a second buffered output, whereby the first and second outputs are buffered.

11. The self-biased differential buffer of claim 10 further comprising:

a first buffered reset transistor for driving the first output to a first state during reset or during the power-down mode;

a second buffered reset transistor for driving the second output to a second state that is a complement of the first state during reset or during the power-down mode.

12. A balanced self-biased differential buffer comprising:

first amplifier means, receiving a first input, for generating a first output and a first bias node, the first amplifier means comprising:

first current source means for generating a first current to a first upper node in response to a self-bias node;

first current sink means for receiving a current from a first lower node in response to the self-bias node;

first upper drive transistor means for driving a current from the first upper node to the first output in response to the first input;

first upper self-bias transistor means for driving a current from the first upper node to the first bias node in response to the first input;

first lower drive transistor means for driving a current from the first output to the first lower node in response to the first input;

first lower self-bias transistor means for driving a current from the first bias node to the first lower node in response to the first input;

first transmission gate means for conducting between the first bias node and the self-bias node;

second amplifier means, receiving a second input, for generating a second output and a second bias node, the second amplifier means comprising:

second current source means for generating a second current to a second upper node in response to the self-bias node;

second current sink means for receiving a current from a second lower node in response to the self-bias node;

second upper drive transistor means for driving a current from the second upper node to the second output in response to the second input;

second upper self-bias transistor means for driving a current from the second upper node to the second bias node in response to the second input;

second lower drive transistor means for driving a current from the second output to the second lower node in response to the second input;

second lower self-bias transistor means for driving a current from the second bias node to the second lower node in response to the second input; and second transmission gate means for conducting between the second bias node and the self-bias node, whereby the self-bias node is generated between the first and second transmission gate means.

13. The balanced self-biased differential buffer of claim 12 wherein the first and second upper drive transistor means, the first and second upper self-bias transistor means, and the first and second current source means comprise p-channel transistors;

wherein the first and second lower drive transistor means, the first and second lower self-bias transistor means, and the first and second current sink means comprise n-channel transistors.

14. The balanced self-biased differential buffer of claim 12 further comprising:

first upper reset transistor means for blocking conduction of the first current through the first current source transistor means in response to a reset signal;

first lower reset transistor means for blocking conduction of current through the first current sink means in response to an inverse of the reset signal;

second upper reset transistor means for blocking conduction of the second current through the second current source transistor means in response to the reset signal;

second lower reset transistor means for blocking conduction of current through the second current sink means in response to the inverse of the reset signal.

15. The balanced self-biased differential buffer of claim 14 wherein the first and second upper reset transistor means comprise p-channel transistors; and wherein the first and second lower reset transistor means comprise n-channel transistors.

16. The balanced self-biased differential buffer of claim 15 wherein the first transmission gate means comprises:

a first p-channel transistor having a gate driven by the reset signal, having a channel between the first bias node and the self-bias node;

an first n-channel transistor having a gate driven by the reset signal, having a channel between the first bias node and the self-bias node;

wherein the second transmission gate means comprises:

a second p-channel transistor having a gate driven by the reset signal, having a channel between the second bias node and the self-bias node;

an second n-channel transistor having a gate driven by the reset signal, having a channel between the second bias node and the self-bias node.

17. A self-biasing differential buffer comprising:

a first input signal;

a second input signal;

a first current-source transistor, having a gate driven by a self-bias node;

a first upper reset transistor, having a gate driven by a mode signal;

wherein the first current-source transistor and the first upper reset transistor have channels in series between a power supply and a first upper branching node;

a first upper drive transistor, having a gate receiving the first input signal, a source connected to the first upper branching node, and a drain connected to a first output node;

a first upper bias-generating transistor, having a gate receiving the first input signal, a source connected to the first upper branching node, and a drain connected to a first bias-generating node;

a first lower drive transistor, having a gate receiving the first input signal, a source connected to the first lower branching node, and a drain connected to the first output node;

a first lower bias-generating transistor, having a gate receiving the first input signal, a source connected to the first lower branching node, and a drain connected to the first bias-generating node;

a first current-sink transistor, having a gate driven by the self-bias node;

a first lower reset transistor, having a gate driven by an inverse of the mode signal;

wherein the first current-sink transistor and the first lower reset transistor have channels in series between a first lower branching node and a ground;

a first p-channel transmission gate transistor having a gate driven by the mode signal, and a channel between the first bias-generating node and the self-bias node;

a first n-channel transmission gate transistor having a gate driven by the inverse of the mode signal, and a channel between the first bias-generating node and the self-bias node;

a second current-source transistor, having a gate driven by the self-bias node;

a second upper reset transistor, having a gate driven by the mode signal;

wherein the second current-source transistor and the second upper reset transistor have channels in series between the power supply and a second upper branching node;

a second upper drive transistor, having a gate receiving the second input signal, a source connected to the second upper branching node, and a drain connected to a second output node;

a second upper bias-generating transistor, having a gate receiving the second input signal, a source connected to the second upper branching node, and a drain connected to a second bias-generating node;

a second lower drive transistor, having a gate receiving the second input signal, a source connected to the second lower branching node, and a drain connected to the second output node;

a second lower bias-generating transistor, having a gate receiving the second input signal, a source connected to the second lower branching node, and a drain connected to the second bias-generating node;

a second current-sink transistor, having a gate driven by the self-bias node;

a second lower reset transistor, having a gate driven by the inverse of the mode signal;

wherein the second current-sink transistor and the second lower reset transistor have channels in series between a second lower branching node and the ground;

a second p-channel transmission gate transistor having a gate driven by the mode signal, and a channel between the second bias-generating node and the self-bias node;

a second n-channel transmission gate transistor having a gate driven by the inverse of the mode signal, and a channel between the second bias-generating node and the self-bias node.

18. The self-biasing differential buffer of claim 17 wherein the first and second upper drive transistors, the first and second current-source transistors, the first and second upper reset transistors, and the first and second upper bias-generating transistors are p-channel transistors;

wherein the first and second lower drive transistors, the first and second current-sink transistors, the first and second lower reset transistors, and the first and second lower bias-generating transistors are n-channel transistors.

19. The self-biasing differential buffer of claim 18 wherein the first input signal and the second input signal are differential signals driven to opposite states.

20. The self-biasing differential buffer of claim 18 wherein the first input signal is a relatively constant reference voltage and wherein the second input signal is a time-varying input signal.

21. The self-biasing differential buffer of claim 20 wherein the reference voltage is about half of a power-supply voltage of the power supply.

* * * * *